(12) United States Patent
Hiraoka et al.

(10) Patent No.: US 7,994,584 B2
(45) Date of Patent: Aug. 9, 2011

(54) SEMICONDUCTOR DEVICE HAVING NON-SILICIDE REGION IN WHICH NO SILICIDE IS FORMED ON DIFFUSION LAYER

(75) Inventors: Takayuki Hiraoka, Kawasaki (JP); Kuniaki Utsumi, Yokohama (JP); Tsutomu Kojima, Yokohama (JP); Kenji Honda, Kawasaki (JP)

(73) Assignee: Kabsuhiki Kaisha Toshiba, Tokyo (JP)

( * ) Notice: Subject to any disclaimer, the term of this patent is extended or adjusted under 35 U.S.C. 154(b) by 350 days.

(21) Appl. No.: 12/277,456

(22) Filed: Nov. 25, 2008

(65) Prior Publication Data
US 2009/0159973 A1 Jun. 25, 2009

(30) Foreign Application Priority Data
Dec. 25, 2007 (JP) ................................. 2007-333302

(51) Int. Cl.
*H01L 21/331* (2006.01)
(52) U.S. Cl. ........ 257/369; 257/341; 257/344; 257/371; 257/E27.016
(58) Field of Classification Search .......... 257/336–344, 257/369–373, 382–388
See application file for complete search history.

(56) References Cited

U.S. PATENT DOCUMENTS
7,372,108 B2 * 5/2008 Iinuma ........................... 257/369

FOREIGN PATENT DOCUMENTS
JP 2006-339444 12/2006
* cited by examiner

*Primary Examiner* — Dung A. Le
(74) *Attorney, Agent, or Firm* — Turocy & Watson, LLP

(57) ABSTRACT

A semiconductor device includes first and second MOSFETs corresponding to at least first power source voltage and second power source voltage lower than the first power source voltage, and non-silicide regions formed in drain portions of the first and second MOSFETs and having no silicide formed therein. The first MOSFET includes first diffusion layers formed in source/drain portions, a second diffusion layer formed below a gate portion and formed shallower than the first diffusion layer and a third diffusion layer formed with the same depth as the second diffusion layer in the non-silicide region, and the second MOSFET includes fourth diffusion layers formed in source/drain portions, a fifth diffusion layer formed below a gate portion and formed shallower than the fourth diffusion layer and a sixth diffusion layer formed shallower than the fourth diffusion layer and deeper than the fifth diffusion layer in the non-silicide region.

16 Claims, 9 Drawing Sheets

US 7,994,584 B2

SEMICONDUCTOR DEVICE HAVING NON-SILICIDE REGION IN WHICH NO SILICIDE IS FORMED ON DIFFUSION LAYER

CROSS-REFERENCE TO RELATED APPLICATIONS

This application is based upon and claims the benefit of priority from prior Japanese Patent Application No. 2007-333302, filed Dec. 25, 2007, the entire contents of which are incorporated herein by reference.

BACKGROUND OF THE INVENTION

1. Field of the Invention

This invention relates to a semiconductor device and more particularly to a metal oxide semiconductor field-effect transistor (MOSFET) electrostatic discharge (ESD) protection device for preventing a current such as electrostatic surge from flowing into a semiconductor integrated circuit device.

2. Description of the Related Art

Conventionally, semiconductor integrated circuit devices having ESD protection devices provided thereon have been developed. The ESD protection device is provided to prevent a current such as electrostatic surge from flowing into the semiconductor integrated circuit device. Some MOSFET ESD protection devices among the above ESD protection devices are designed to enhance the ESD discharging ability by forming silicide unformed portions (non-silicide regions) in drain regions and source regions (see, for example, Jpn. Pat. Appln. KOKAI Publication No. 2006-339444). That is, since a current is not concentrated in the silicide portion in a diffusion layer in the portion formed as the non-silicide region, the breakdown voltage of the device acting as the ESD protection device is enhanced.

In the ESD protection device, a diffusion layer with the same junction depth as that of a diffusion layer lying below the gate is formed in the non-silicide region in some cases. However, if this method is applied to a transistor for low power source voltage (or low voltage which is hereinafter referred to as LV) used as the ESD protection device, the junction depth of the diffusion layer is reduced and junction leakage may occur in the non-silicide region. In the above document, it is disclosed that the resistance of the non-silicide region is adjusted by using a diffusion layer with the same junction depth as that of a diffusion layer lying below the gate of the LV transistor in the non-silicide region of a transistor for high power source voltage (or high voltage which is hereinafter referred to as HV) used as the ESD protection device.

However, in the above document, it is not disclosed that a countermeasure against junction leakage is taken by forming a diffusion layer with the same junction depth as that of a diffusion layer lying below the gate of the HV transistor in the non-silicide region of the LV transistor.

BRIEF SUMMARY OF THE INVENTION

According to a first aspect of the present invention, there is provided a semiconductor device which includes first and second metal oxide semiconductor field-effect transistors (MOSFETs) corresponding to at least first power source voltage and second power source voltage lower than the first power source voltage, and non-silicide regions formed in drain portions of the first and second MOSFETs and having no silicide formed therein, wherein the first MOSFET includes first diffusion layers formed in source/drain portions, a second diffusion layer formed below a gate portion and formed shallower than the first diffusion layer and a third diffusion layer formed with the same depth as the second diffusion layer in the non-silicide region, and the second MOSFET includes fourth diffusion layers formed in source/drain portions, a fifth diffusion layer formed below a gate portion and formed shallower than the fourth diffusion layer and a sixth diffusion layer formed shallower than the fourth diffusion layer and deeper than the fifth diffusion layer in the non-silicide region.

According to a second aspect of the present invention, there is provided a semiconductor device which includes a plurality of first metal oxide semiconductor field-effect transistors (MOSFETs) corresponding to first power source voltage, the plurality of first MOSFETs including non-silicide regions formed in drain portions thereof and having no silicide formed therein, first diffusion layers formed in source/drain portions, second diffusion layers formed below gate portions and formed shallower than the first diffusion layer and third diffusion layers formed with the same depth as the second diffusion layer in the non-silicide regions, and a plurality of second MOSFETs corresponding to second power source voltage lower than the first power source voltage, wherein the plurality of second MOSFETs include non-silicide regions formed in drain portions thereof and having no silicide formed therein, fourth diffusion layers formed in source/drain portions, fifth diffusion layers formed below gate portions and formed shallower than the fourth diffusion layer and sixth diffusion layers formed shallower than the fourth diffusion layer and deeper than the fifth diffusion layer in the non-silicide regions.

According to a third aspect of the present invention, there is provided a semiconductor device which includes a plurality of metal oxide semiconductor field-effect transistors (MOSFETs) respectively corresponding to a plurality of power source voltages, and non-silicide regions formed in drain portions of the plurality of MOSFETs and having no silicide formed therein, wherein diffusion layer resistance regions with the same depth as that of LDD diffusion layers of that MOSFET which corresponds to highest power source voltage among the plurality of MOSFETs are formed in the non-silicide regions of the plurality of MOSFETs.

DETAILED DESCRIPTION OF THE INVENTION

Embodiments of the present invention will be described with reference to the accompanying drawings. It should be noted that the drawings are schematic ones and so are not to scale. The following embodiments are directed to a device and a method for embodying the technical concept of the present invention and the technical concept does not specify the material, shape, structure or configuration of components of the present invention. Various changes and modifications can be made to the technical concept without departing from the scope of the claimed invention.

First Embodiment

Figure 1A:
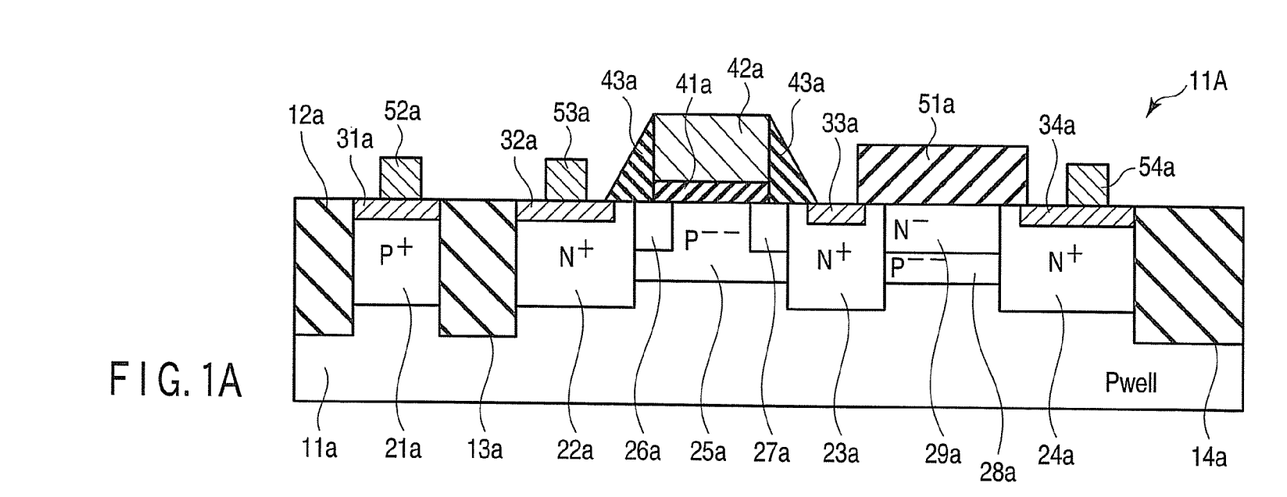
FIGS. 1A and 1B are cross-sectional views showing an example of the structure of a semiconductor device (MOSFET ESD protection device) according to a first embodiment of this invention.
Figure 1B:
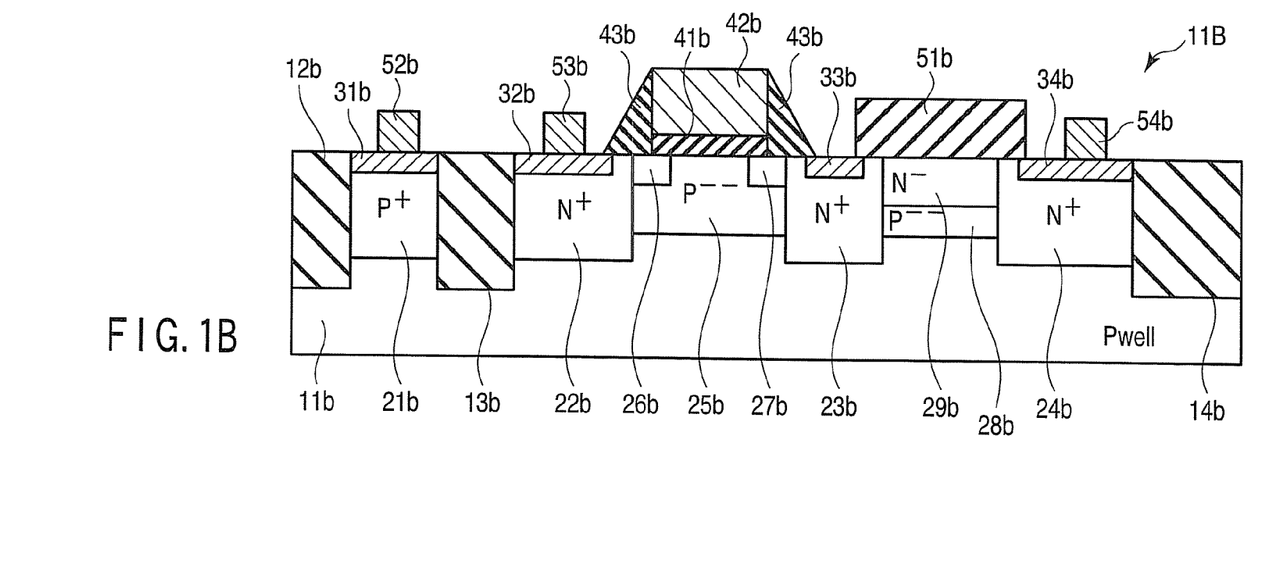

FIGS. 1A and 1B show an example of the structure of a semiconductor device according to a first embodiment of this invention. In this embodiment, a case wherein this invention is applied to an ESD protection device having an nMOSFET structure is explained. FIG. 1A shows an ESD protection device used for high voltage (HV) corresponding to first power source voltage and extracted from a plurality of ESD protection devices provided on a semiconductor integrated circuit device and FIG. 1B shows an ESD protection device used for low voltage (LV) corresponding to second power source voltage lower than the first power source voltage and extracted from the ESD protection devices.

As shown in the cross-sectional view of FIG. 1A, a plurality of element isolation regions (shallow trench isolation [STI]) 12a, 13a, 14a are formed on the surface portion of a P-well region (or a p-type semiconductor substrate formed of silicon, for example) 11a of an HV ESD protection device 11A. A P+ region 21a for a substrate contact is formed on that surface portion of the P-well region 11a which corresponds to a portion between the element isolation regions 12a and 13a.

First to third N+ diffusion layers (first diffusion layers) 22a, 23a, 24a with high concentration are selectively formed on those surface portions of the P-well region 11a which correspond to a portion between the element isolation regions 13a and 14a. The first N+ diffusion layer 22a forms a source region and the second and third diffusion layers 23a and 24a form drain regions. Silicide layers 31a, 32a, 33a, 34a are respectively formed on the surface portions of the P+ region 21a and first to third N+ diffusion layers 22a, 23a, 24a.

A gate electrode (polysilicon gate) 42a is formed above that portion of the P-well region 11a which corresponds to a portion between the first and second N+ diffusion layers 22a and 23a with a gate insulating film 41a disposed therebetween. Gate sidewall insulating films 43a are formed on the sidewall portions of the gate insulating film 41a and gate electrode 42a. A P-- diffusion layer 25a acting as a channel region is formed on that surface portion of the P-well region 11a which corresponds to a portion lying directly below the gate electrode 42a (below the gate), that is, a portion between the first and second N+ diffusion layers 22a and 23a. A source-side lightly doped drain (LDD) diffusion layer (an N- layer acting as a second diffusion layer) 26a used to form an extension region is formed in a position adjacent to the first N+ diffusion layer 22a on the surface portion of the P-- diffusion layer 25a. Further, a drain-side LDD diffusion layer (an N- layer acting as a second diffusion layer) 27a used to form an extension region is formed in a position adjacent to the second N+ diffusion layer 23a on the surface portion of the P-- diffusion layer 25a. The impurity junctions of the LDD diffusion layers 26a, 27a are shallower than those of the first to third N+ diffusion layers 22a, 23a, 24a and the depths thereof are controlled according to the first power source voltage.

A silicide block 51a used to form a silicide unformed portion (non-silicide region) is formed above that portion of the P-well region 11a which corresponds to a portion between the second and third N+ diffusion layers 23a and 24a. A P-- diffusion layer 28a and a diffusion layer resistance region (an N- layer acting as a third diffusion layer) 29a acting as a ballast resistor are formed directly under the silicide block 51a, that is, on that surface portion of the P-well region 11a which corresponds to the portion between the second and third N+ diffusion layers 23a and 24a. The P-- diffusion layer 28a is formed with the same impurity concentration (distribution) and the same junction depth as those of the P-- diffusion layer 25a. The diffusion layer resistance region 29a is formed with the same impurity concentration and the same junction depth as those of the LDD diffusion layers 26a, 27a. That is, as the diffusion layer resistance region 29a of the HV ESD protection device 11A, a region that is the same as the LDD diffusion layers 26a, 27a lying directly below the gate electrode 42a or a region that is connected to the surrounding second and third N+ diffusion layers 23a, 24a having deep junctions and formed with sufficient depth to contain the silicide layers 33a, 34a without causing any problem associated with the junction leakage is used.

Symbols 52a, 53a, 54a in the drawing denote contacts respectively connected to the silicide layers 31a, 32a, 34a.

Further, as shown in the cross-sectional view of FIG. 1B, a plurality of element isolation regions (STI) 12b, 13b, 14b are formed on the surface portion of a P-well region (or a p-type semiconductor substrate formed of silicon, for example) 11b of an LV ESD protection device 11B. A P+ region 21b for a substrate contact is formed on that surface portion of the P-well region 11b which corresponds to a portion between the element isolation regions 12b and 13b.

First to third N+ diffusion layers (fourth diffusion layers) 22b, 23b, 24b with high concentration are selectively formed on that surface portion of the P-well region 11b which corresponds to a portion between the element isolation regions 13b and 14b. The first N+ diffusion layer 22b forms a source region and the second and third diffusion layers 23b, 24b form drain regions. Silicide layers 31b, 32b, 33b, 34b are respectively formed on the surface portions of the P+ region 21b and first to third N+ diffusion layers 22b, 23b, 24b.

A gate electrode (polysilicon gate) 42b is formed above that portion of the P-well region 11b which corresponds to a portion between the first and second N+ diffusion layers 22b and 23b with a gate insulating film 41b disposed therebetween. On the sidewall portions of the gate insulating film 41b and gate electrode 42b, gate sidewall insulating films 43b are formed. A P-- diffusion layer 25b acting as a channel region is formed directly below the gate electrode 42b (below the gate), that is, on that surface portion of the P-well region 11b which corresponds to a portion between the first and second N+ diffusion layers 22b and 23b. A source-side lightly doped drain (LDD) diffusion layer (an N- layer acting as a fifth diffusion layer) 26b used to form an extension region is formed in a position adjacent to the first N+ diffusion layer 22b on the surface portion of the P-- diffusion layer 25b. A drain-side LDD diffusion layer (an N- layer acting as a fifth diffusion layer) 27b used to form an extension region is formed in a position adjacent to the second N+ diffusion layer 23b on the surface portion of the P-- diffusion layer 25b. The impurity junctions of the LDD diffusion layers 26b, 27b are shallower than those of the LDD diffusion layers 26a, 27a and the depths thereof are controlled according to the second power source voltage.

A silicide block 51b used to form a non-silicide region is formed on that portion of the P-well region 11b which corresponds to a portion between the second and third N+ diffusion layers 23b and 24b. A P-- diffusion layer (seventh diffusion layer) 28b and a diffusion layer resistance region (an N- layer acting as a sixth diffusion layer) 29b acting as a ballast resistor are formed directly under the silicide block 51b, that is, on that surface portion of the P-well region 11b which corresponds to a portion between the second and third N+ diffusion layers 23b and 24b. The P-- diffusion layer 28b is formed with the same impurity concentration and the same junction depth as the P-- diffusion layer 25b. The diffusion layer resistance region 29b is formed with the same impurity concentration and the same junction depth as the diffusion layer resistance region 29a. That is, as the diffusion layer resistance region 29b of the LV ESD protection device 11B, a region that is different from the LDD diffusion layers 26b, 27b lying directly below the gate electrode 42b and is the same as the LDD diffusion layers 26a, 27a lying directly below the gate electrode 42a of the HV ESD protection device 11A is used. The diffusion layer resistance region 29b is formed at the same time as and in the same formation process as the LDD diffusion layers 26a, 27a and diffusion layer resistance region 29a by use of the same mask. As a result, the diffusion layer resistance region 29b that is formed in a small area and does not cause junction leakage can be easily realized only by using an existing MOSFET formation process (normal transistor formation process).

Symbols 52b, 53b, 54b in the drawing denote contacts respectively connected to the silicide layers 31b, 32b, 34b.

Figure 2:
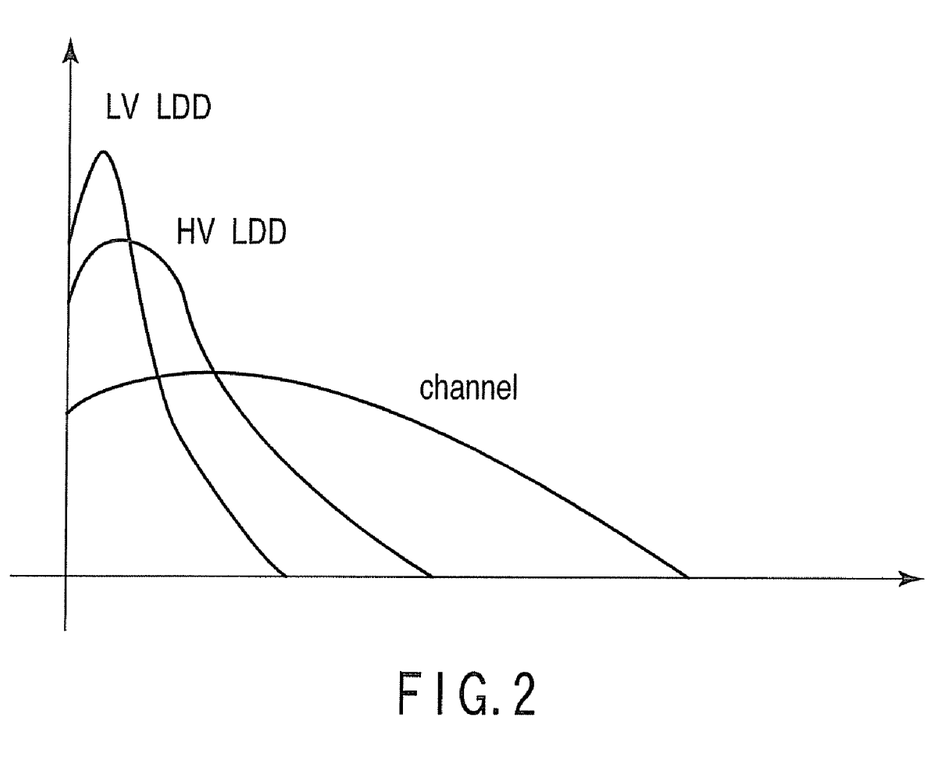
FIG. 2 is a diagram showing the relation between the concentrations of a P−− diffusion layer and a diffusion layer resistance region of the ESD protection device according to the first embodiment.

FIG. 2 shows the relation between the concentrations of the P-- diffusion layer and the diffusion layer resistance region. When the LDD structure (HV LDD) of the HV ESD protection device 11A is used as the ballast resistor of the LV ESD protection device 11B, it is rather preferable than in a case wherein the LDD structure (LV LDD) of the LV ESD protection device 11B is used. As is clearly understood from the drawing, this is because the junction leakage in the non-silicide region of the LV ESD protection device 11B can be reduced by using a gentle and deep junction, for example, between the P-- diffusion layer 25a and the LDD diffusion layers 26a, 27a of the HV ESD protection device 11A. Thus, the ESD discharging ability can be enhanced by forming the ballast resistor of the HV LDD structure that is formed of the diffusion layer resistance region 29b in the non-silicide region of the LV ESD protection device 11B.

The junction depth of the diffusion layer below the gate of the transistor is set to approximately ¼ the gate length in order to suppress the short channel effect. For example, if it is supposed that the gate length of an HV transistor of an input/output portion is set to approximately 400 nm with the transistor technique in which the gate length of an LV transistor is set in a 90 nm-generation, the junction depth of a diffusion layer below the gate of the LV transistor is set to 20 to 25 nm and the junction depth of a diffusion layer below the gate of the HV transistor is set to approximately 100 nm.

Next, a manufacturing method of the ESD protection device (FIGS. 11A, 11B) with the nMOSFET structure described above is simply explained with reference to FIG. 3 to FIGS. 8A and 8B.

Figure 3:
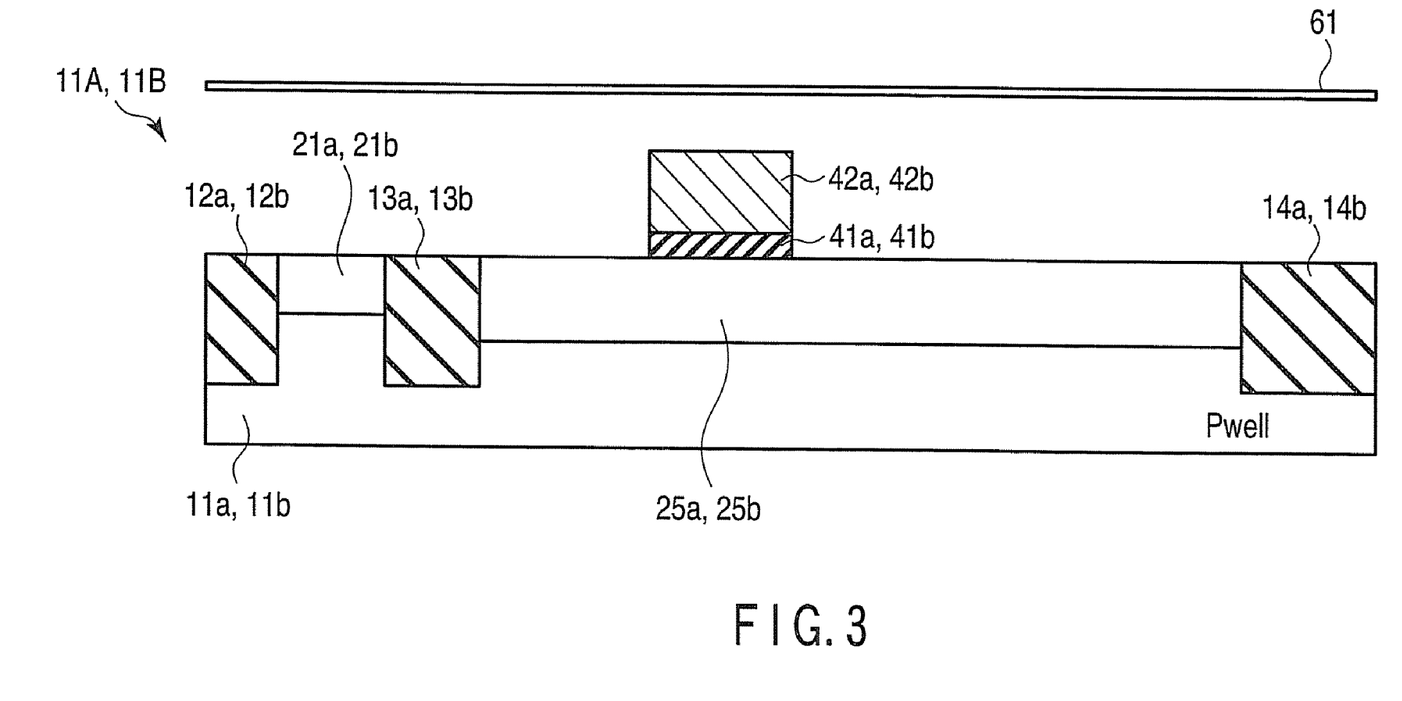
FIG. 3 is a cross-sectional view showing a manufacturing method of the ESD protection device according to the first embodiment.

First, for example, as shown in FIG. 3, a plurality of element isolation regions 12a, 13a, 14a and 12b, 13b, 14b are formed on the surface portions of P-well regions 11a, 11b by use of an existing MOSFET formation process. Then, P+ regions 21a, 21b for substrate contacts and P-- diffusion layers 25a, 25b are respectively formed on the surface portions of the P-well regions 11a, 11b. After this, gate insulating films 41a, 41b and gate electrodes 42a, 42b are formed on the P-well regions 11a, 11b. A reference symbol 61 in the drawing denotes a mask used at the ion-implantation time in a simplified form.

Figure 4:
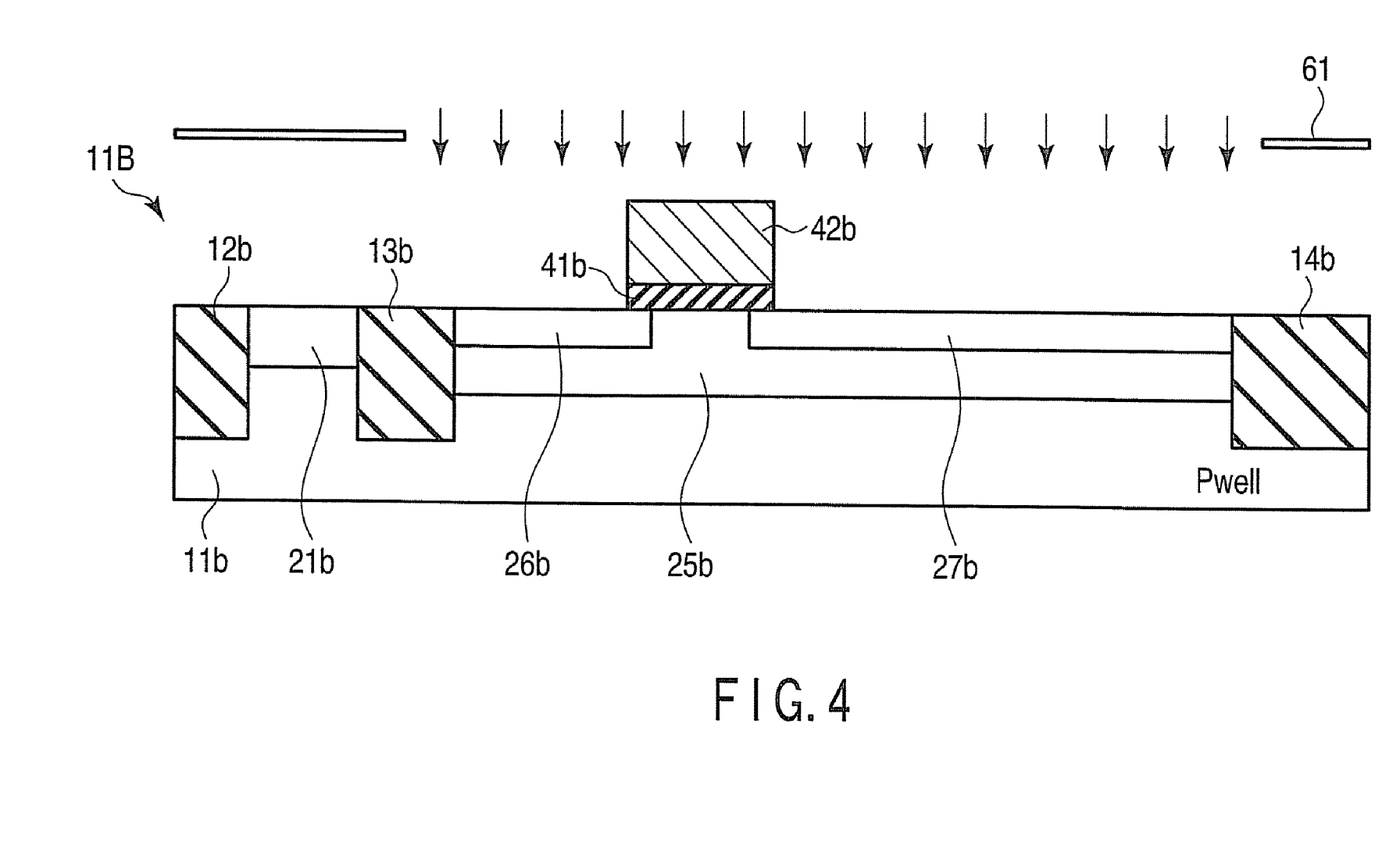
FIG. 4 is a cross-sectional view showing a manufacturing method of the ESD protection device according to the first embodiment.

Next, for example, as shown in FIG. 4, LDD diffusion layers 26b, 27b are formed in self-alignment with the gate electrode 42b in the LV ESD protection device 11B.

Figure 5:
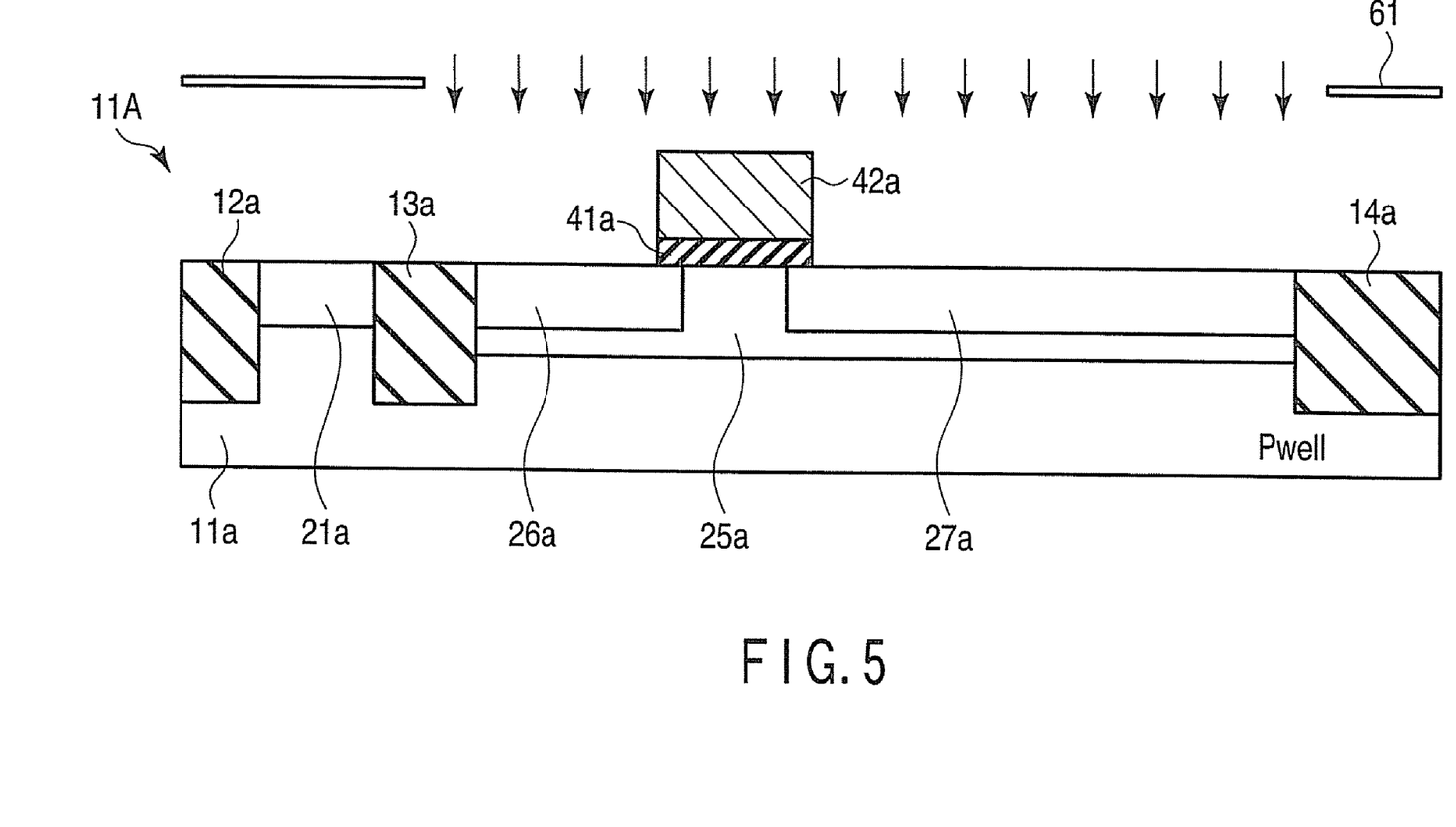
FIG. 5 is a cross-sectional view showing the manufacturing method of the ESD protection device according to the first embodiment.

Then, for example, as shown in FIG. 5, LDD diffusion layers 26a, 27a are formed in self-alignment with the gate electrode 42a in the HV ESD protection device 11A.

Figure 6:
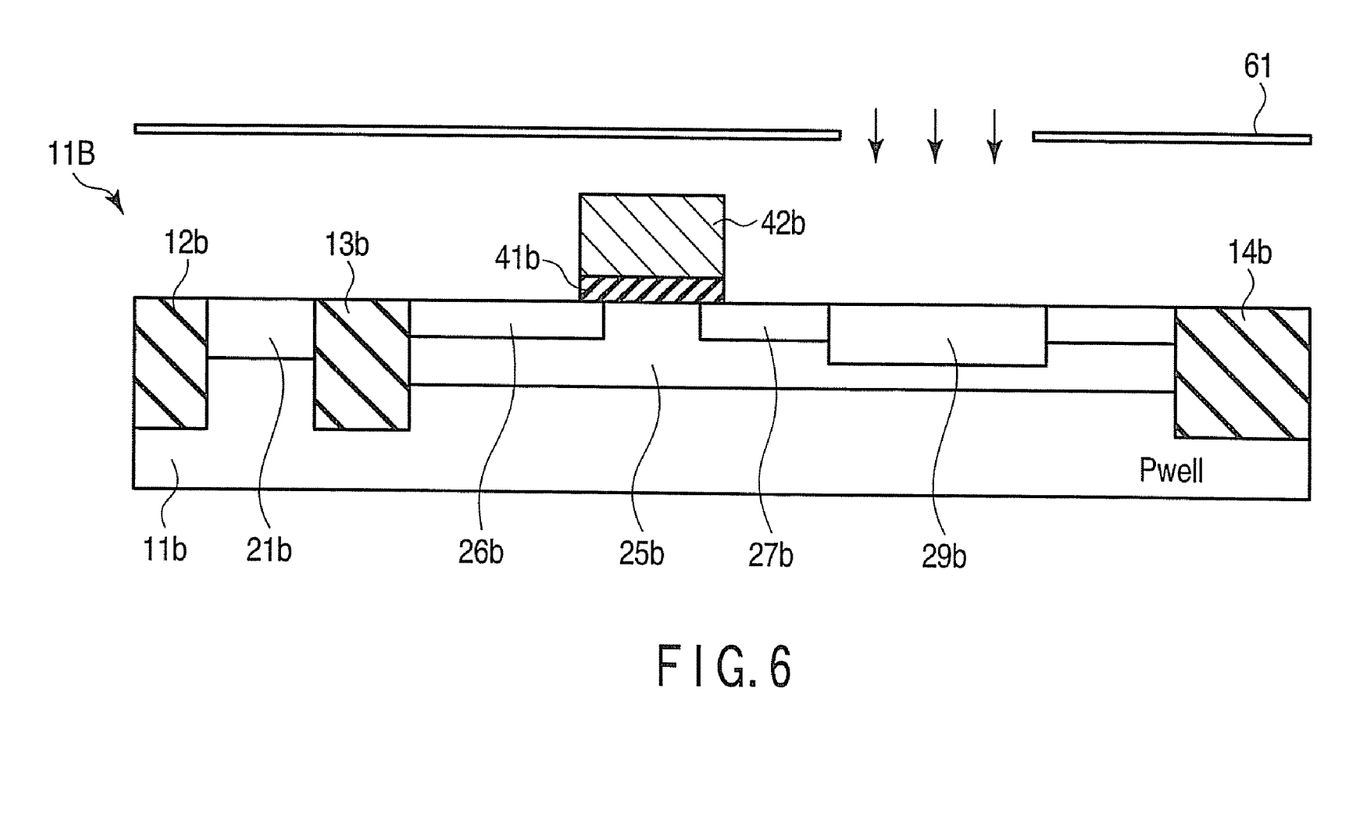
FIG. 6 is a cross-sectional view showing the manufacturing method of the ESD protection device according to the first embodiment.

At this time, for example, as shown in FIG. 6, a diffusion layer resistance region 29b having the same junction depth as the LDD diffusion layers 26a, 27a of the HV ESD protection device 11A is formed in an area in which a silicide block 51b is to be formed in the LV ESD protection device 11B by using the mask 61 having an opening with the width determined by taking the mask misalignment and spread of the diffusion layer into consideration.

Figure 7A:
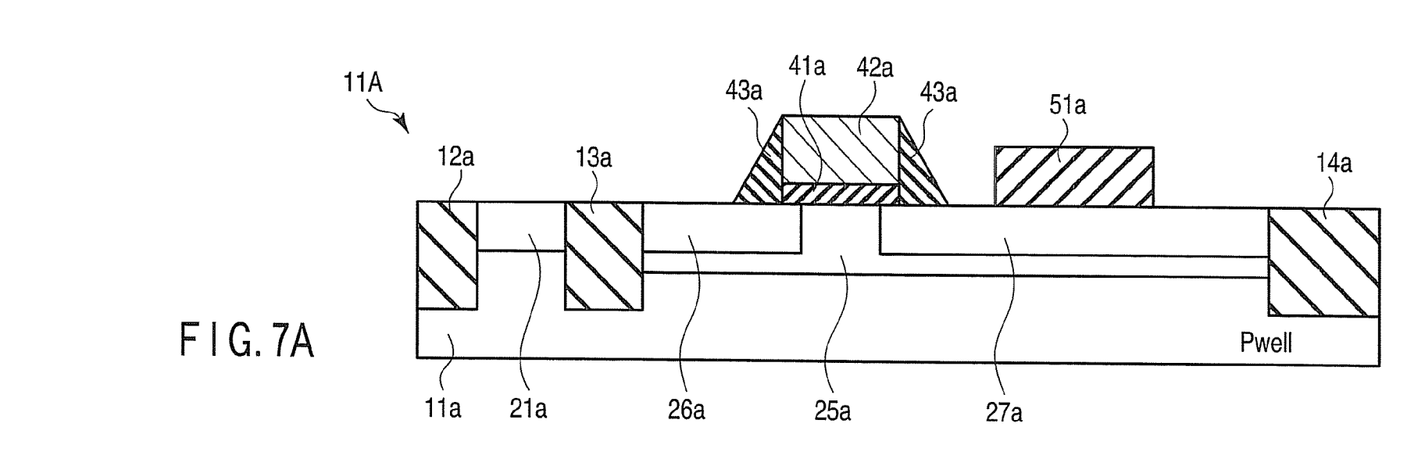
FIGS. 7A and 7B are cross-sectional views showing the manufacturing method of the ESD protection device according to the first embodiment.
Figure 7B:
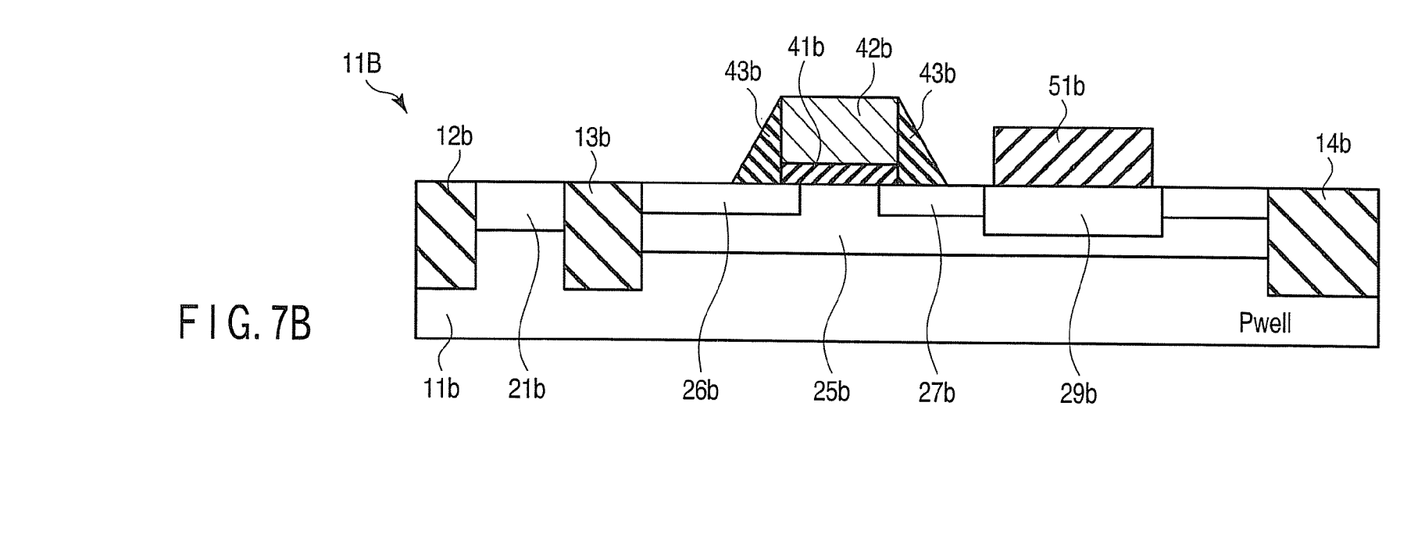

Next, for example, as shown in FIGS. 7A and 7B, gate sidewall insulating films 43a and silicide block 51a of the HV ESD protection device 11A are formed and, at the same time, gate sidewall insulating films 43b and silicide block 51b of the LV ESD protection device 11B are formed by using the existing MOSFET formation process.

Figure 8A:
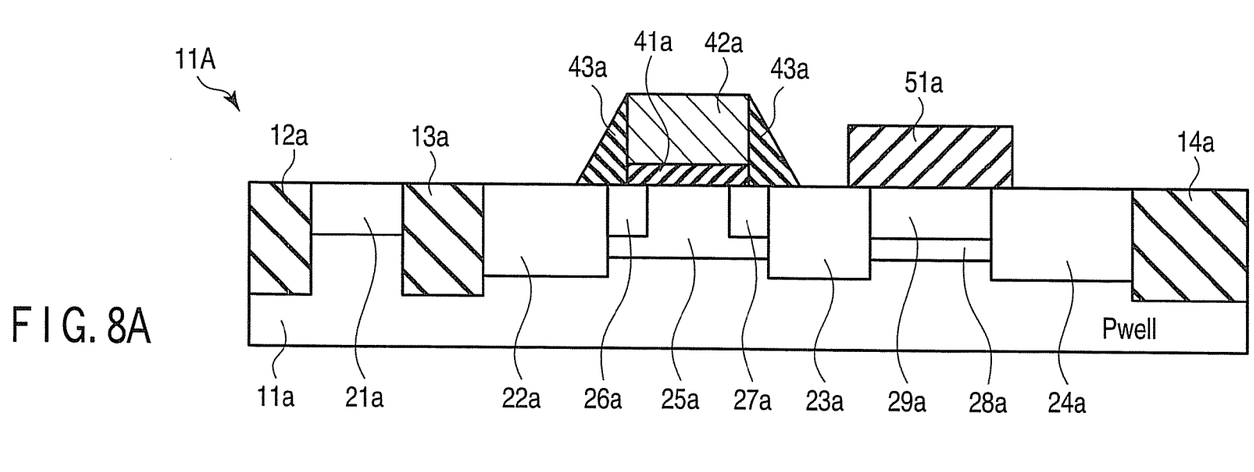
FIGS. 8A and 8B are cross-sectional views showing the manufacturing method of the ESD protection device according to the first embodiment.
Figure 8B:
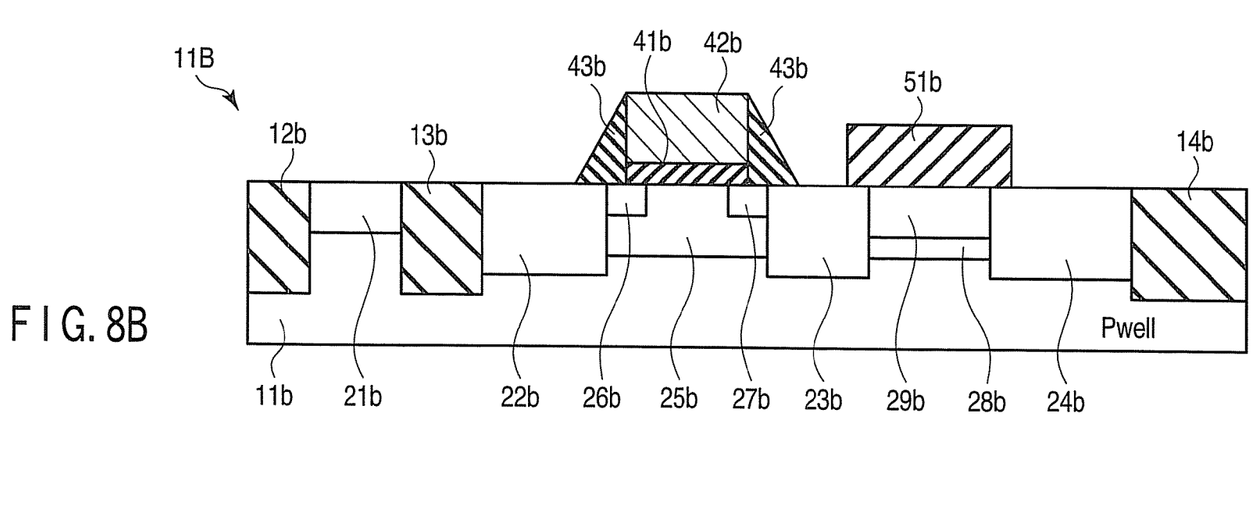

Next, for example, as shown in FIGS. 8A and 8B, deep N+ diffusion layers 22a, 23a, 24a with high concentration are formed in the source/drain regions of the HV ESD protection device 11A and, at the same time, deep N+ diffusion layers 22b, 23b, 24b with high concentration are formed in the source/drain regions of the LV ESD protection device 11B by using the existing MOSFET formation process.

At this time, deep diffusion layers with high concentration are prevented from being formed in portions directly under the silicide blocks due to the presence of the silicide blocks 51a, 51b.

After this, silicide layers 31a, 32a, 33a, 34a and 31b, 32b, 33b, 34b and contacts 52a, 53a, 54a and 52b, 53b, 54b are formed to complete the HV ESD protection device 11A and LV ESD protection device 11B with the structures shown in FIGS. 1A and 1B.

As described above, the LDD structure (HV LDD) of the HV ESD protection device 11A is used in the drain portion (non-silicide region) of the LV ESD protection device 11B. That is, the diffusion layer resistance region 29b having the same junction depth as the LDD diffusion layers 26a, 27a of the HV ESD protection device 11A is formed directly under the silicide block 51b of the LV ESD protection device 11B. Thus, the LV ESD protection device 11B can be formed with the structure of a small area without causing a junction leakage problem. Therefore, a MOSFET ESD protection device that corresponds to low power source voltage and enhances the ESD discharging ability without providing an additional step to the existing MOSFET formation process can be realized.

Second Embodiment

Figure 9A:
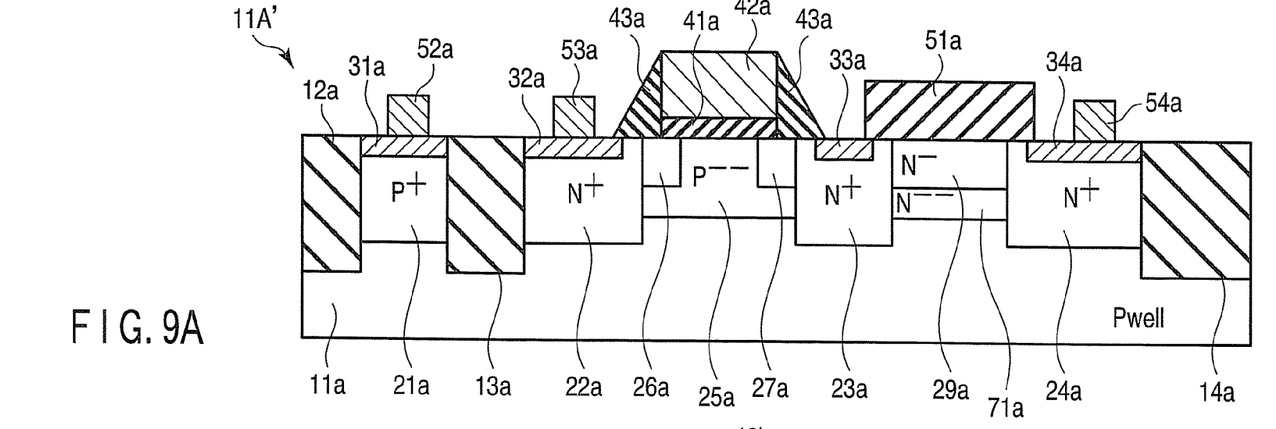
FIGS. 9A and 9B are cross-sectional views showing an example of the structure of a semiconductor device (MOSFET ESD protection device) according to a second embodiment of this invention.
Figure 9B:
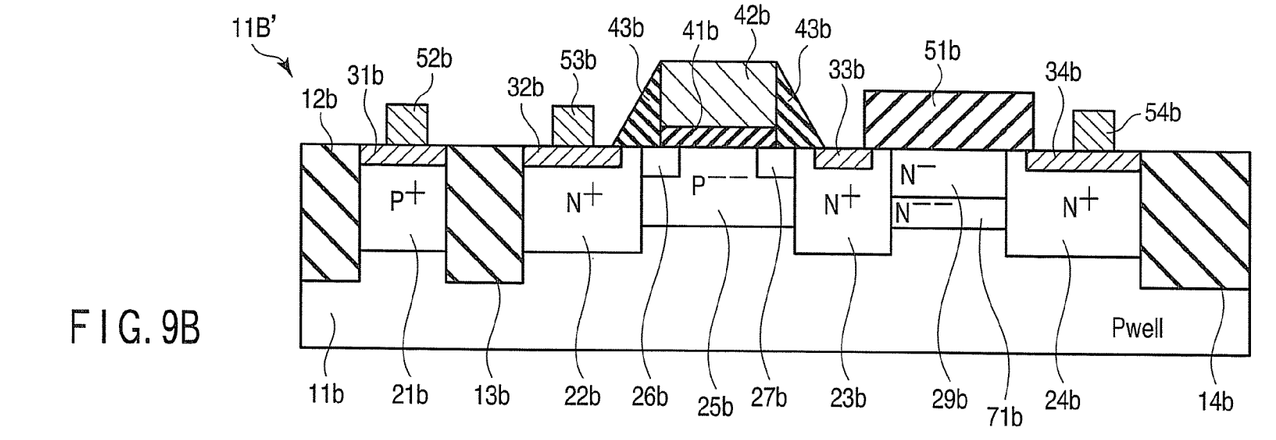

FIGS. 9A and 9B show an example of the structure of a semiconductor device according to a second embodiment of this invention. In the present embodiment, a case wherein this invention is applied to an ESD protection device having an nMOSFET structure is explained. In this case, FIG. 9A shows a high power source voltage (HV) ESD protection device that corresponds to first power source voltage and is extracted from a plurality of ESD protection devices provided on a semiconductor integrated circuit device and FIG. 9B shows a low power source voltage (LV) ESD protection device that corresponds to second power source voltage lower than the first power source voltage and is extracted from the ESD protection devices. In this example, portions that are the same as those of the first embodiment (see FIGS. 1A and 1B) are denoted by the same reference symbols and detailed explanation thereof is omitted.

In the case of this embodiment, diffusion layer resistance regions (N− layers) 29a, 29b acting as ballast resistors and N−− diffusion layers (eighth layers) 71a, 71b used for the formation of pMOSFETs (not shown) are respectively formed directly under silicide blocks 51a, 51b that constitute drain portions. That is, for example, as shown in FIG. 9A, an HV ESD protection device 11A' is formed with the structure in which the N−− diffusion layer 71a for the channel region of the pMOSFET is formed as the diffusion layer directly below the silicide block 51a and the diffusion layer resistance region 29a that is formed at the same time as and in the same formation step as the LDD diffusion layers 26a, 27a by use of the same mask is superimposed on the above diffusion layer.

Further, for example, as shown in FIG. 9B, an LV ESD protection device 11B' is formed with the structure in which the N−− diffusion layer 71b for the channel region of the pMOSFET is formed as the diffusion layer directly below the silicide block 51b and the diffusion layer resistance region 29b that is formed at the same time as and in the same formation step as the LDD diffusion layers 26a, 27a and diffusion layer resistance region 29a of the HV ESD protection device 11A' by use of the same mask is superimposed on the above diffusion layer.

The N−− diffusion layers 71a, 71b are formed at the same time in the same formation step by use of the same mask when the channel regions of pMOSFETs (not shown) are formed.

Thus, according to the present embodiment, the diffusion layer resistance region that is formed in a small area and has preset resistance without causing a junction leakage problem can be formed only by using the existing MOSFET formation process and the ESD discharging ability can be enhanced.

Particularly, with the structure as shown in the second embodiment, a deep junction can be attained directly below the silicide block without significantly lowering the diffusion layer resistance. Therefore, for example, the junction resistance of the diffusion layer can be further enhanced and a MOSFET ESD protection device having more preferable ESD protection ability can be realized.

In each of the above embodiments, a case wherein this invention is applied to the ESD protection device with the nMOSFET structure is explained as an example, but this invention is not limited to this case. For example, this invention can be similarly applied to an ESD protection device with a pMOSFET structure.

Further, this invention is not limited to the MOSFET ESD protection device with the LDD structure that corresponds to two types of HV and LV power source voltages. For example, this invention can be applied to a MOSFET ESD protection device with an LDD structure that corresponds to three or more types of power source voltages. In this case, an LDD diffusion layer of the ESD protection device that corresponds to the highest power source voltage may be formed as a diffusion layer of a drain portion (directly under the silicide block) of another ESD protection device whose power source voltage is lower than that of the above ESD protection device.

Further, as the diffusion layer resistance region 29b formed directly under the silicide block 51b, any region whose junction is shallower than that of the second N+ diffusion layer 23b and deeper than those of the LDD diffusion layers 26b, 27b can be used.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A semiconductor device comprising:
   first and second metal oxide semiconductor field-effect transistors (MOSFETs) corresponding to at least first power source voltage and second power source voltage lower than the first power source voltage, and
   non-silicide regions formed in drain portions of the first and second MOSFETs and having no silicide formed therein,
   wherein the first MOSFET includes first diffusion layers formed in source/drain portions, a second diffusion layer formed below a gate portion and formed shallower than the first diffusion layer and a third diffusion layer formed with the same depth as the second diffusion layer in the non-silicide region, and the second MOSFET includes fourth diffusion layers formed in source/drain portions, a fifth diffusion layer formed below a gate portion and formed shallower than the fourth diffusion layer and a sixth diffusion layer formed shallower than the fourth diffusion layer and deeper than the fifth diffusion layer in the non-silicide region.

2. The semiconductor device according to claim 1, wherein the fourth diffusion layer has the same depth as the first diffusion layer and the fifth diffusion layer is shallower than the second diffusion layer.

3. The semiconductor device according to claim 1, wherein the sixth diffusion layer has the same depth as the second and third diffusion layers.

4. The semiconductor device according to claim 1, further comprising a seventh diffusion layer whose conductivity type is different from that of the sixth diffusion layer and which is formed in the non-silicide region of the second MOSFET.

5. The semiconductor device according to claim 4, wherein the seventh diffusion layer is deeper than the sixth diffusion layer.

6. The semiconductor device according to claim 1, further comprising an eighth diffusion layer whose conductivity type is the same as that of the sixth diffusion layer and which is used to form a MOSFET having a different conductivity type and formed in the non-silicide region of the second MOSFET.

7. The semiconductor device according to claim 6, wherein the eighth diffusion layer is deeper than the sixth diffusion layer.

8. The semiconductor device according to claim 1, wherein the third and sixth diffusion layers function as ballast resistors.

9. A semiconductor device comprising:
   a plurality of first metal oxide semiconductor field-effect transistors (MOSFETs) corresponding to first power source voltage, the plurality of first MOSFETs including non-silicide regions formed in drain portions thereof and having no silicide formed therein, first diffusion layers formed in source/drain portions, second diffusion layers formed below gate portions and formed shallower than the first diffusion layer and third diffusion layers formed with the same depth as the second diffusion layer in the non-silicide regions, and a plurality of second MOSFETs corresponding to second power source voltage lower than the first power source voltage, wherein the plurality of second MOSFETs include non-silicide regions formed in drain portions thereof and having no silicide formed therein, fourth diffusion layers formed in source/drain portions, fifth diffusion layers formed below gate portions and formed shallower than the fourth diffusion layer and sixth diffusion layers formed shallower than the fourth diffusion layer and deeper than the fifth diffusion layer in the non-silicide regions.

10. The semiconductor device according to claim 9, wherein the fourth diffusion layer has the same depth as the first diffusion layer and the fifth diffusion layer is shallower than the second diffusion layer.

11. The semiconductor device according to claim 9, wherein the sixth diffusion layer has the same depth as the second and third diffusion layers.

12. The semiconductor device according to claim 9, further comprising seventh diffusion layers whose conductivity type is different from that of the sixth diffusion layer and which are formed in the non-silicide regions of the plurality of second MOSFETs.

13. The semiconductor device according to claim 12, wherein the seventh diffusion layer is deeper than the sixth diffusion layer.

14. The semiconductor device according to claim 9, further comprising eighth diffusion layers whose conductivity type is the same as that of the sixth diffusion layer and which are used to form MOSFETs having different conductivity types and formed in the non-silicide regions of the plurality of second MOSFETs.

15. The semiconductor device according to claim 14, wherein the eighth diffusion layer is deeper than the sixth diffusion layer.

16. The semiconductor device according to claim 9, wherein the third and sixth diffusion layers function as ballast resistors.

* * * * *